United States Patent
Sukekawa

(10) Patent No.: US 10,546,811 B2
(45) Date of Patent: Jan. 28, 2020

(54) ASSEMBLIES WHICH INCLUDE WORDLINES OVER GATE ELECTRODES

(71) Applicant: Micron Technology, Inc., Boise, ID (US)

(72) Inventor: Mitsunari Sukekawa, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/592,027

(22) Filed: May 10, 2017

(65) Prior Publication Data

US 2018/0331029 A1 Nov. 15, 2018

(51) Int. Cl.
| | |
|---|---|
| *H01L 23/522* | (2006.01) |
| *H01L 27/108* | (2006.01) |
| *H01L 27/105* | (2006.01) |
| *H01L 29/78* | (2006.01) |
| *H01L 27/24* | (2006.01) |
| *H01L 29/786* | (2006.01) |
| *H01L 29/66* | (2006.01) |

(52) U.S. Cl.
CPC .... *H01L 23/5225* (2013.01); *H01L 27/10814* (2013.01); *H01L 27/10841* (2013.01); *H01L 27/2454* (2013.01); *H01L 27/1052* (2013.01); *H01L 29/66666* (2013.01); *H01L 29/7827* (2013.01); *H01L 29/78642* (2013.01)

(58) Field of Classification Search
CPC ........... H01L 27/1052; H01L 27/10814; H01L 27/10841; H01L 27/2454; H01L 29/66666; H01L 29/7827; H01L 29/78642
See application file for complete search history.

(56) References Cited

U.S. PATENT DOCUMENTS

| | | | |
|---|---|---|---|
| 6,077,745 A | 6/2000 | Burns, Jr. et al. | |
| 7,371,627 B1 | 5/2008 | Forbes | |
| 8,860,127 B2 | 10/2014 | Cho et al. | |
| 9,236,386 B2 | 1/2016 | Cho et al. | |
| 9,245,893 B1 | 1/2016 | Sukekawa | |
| 2008/0128757 A1* | 6/2008 | Chae | H01L 27/115 257/204 |
| 2009/0236656 A1* | 9/2009 | Sung | H01L 27/10876 257/329 |

(Continued)

Primary Examiner — Mohsen Ahmadi
Assistant Examiner — Christopher M Roland
(74) Attorney, Agent, or Firm — Wells St. John P.S.

(57) ABSTRACT

Some embodiments include an assembly having bitlines extending along a first direction. Semiconductor pillars are over the bitlines and are arranged in an array. The array includes columns along the first direction and rows along a second direction which crosses the first direction. Each of the semiconductor pillars extends vertically. The semiconductor pillars are over the bitlines. The semiconductor pillars are spaced from one another along the first direction by first gaps, and are spaced from one another along the second direction by second gaps. Wordlines extend along the second direction, and are elevationally above the semiconductor pillars. The wordlines are directly over the first gaps and are not directly over the semiconductor pillars. Gate electrodes are beneath the wordlines and are coupled with the wordlines. Each of the gate electrodes is within one of the second gaps. Shield lines may be within the first gaps.

22 Claims, 8 Drawing Sheets

(56) References Cited

U.S. PATENT DOCUMENTS

| | | | |
|---|---|---|---|
| 2010/0140697 A1* | 6/2010 | Yedinak | H01L 29/0692 257/334 |
| 2010/0197121 A1* | 8/2010 | Kim | H01L 27/10817 438/486 |
| 2011/0284939 A1* | 11/2011 | Chung | H01L 27/10876 257/296 |
| 2012/0153365 A1* | 6/2012 | Sung | H01L 27/10876 257/288 |
| 2013/0043525 A1* | 2/2013 | Yu | H01L 27/10814 257/329 |

* cited by examiner

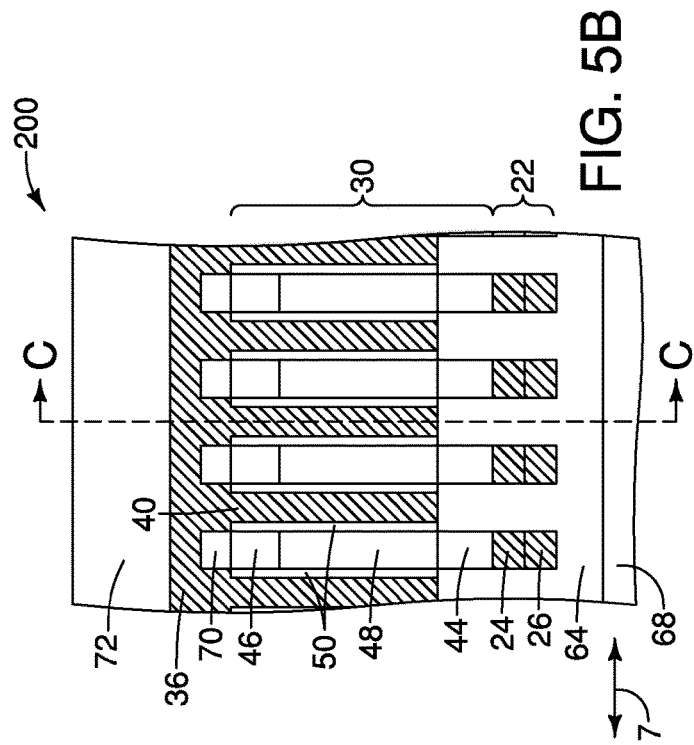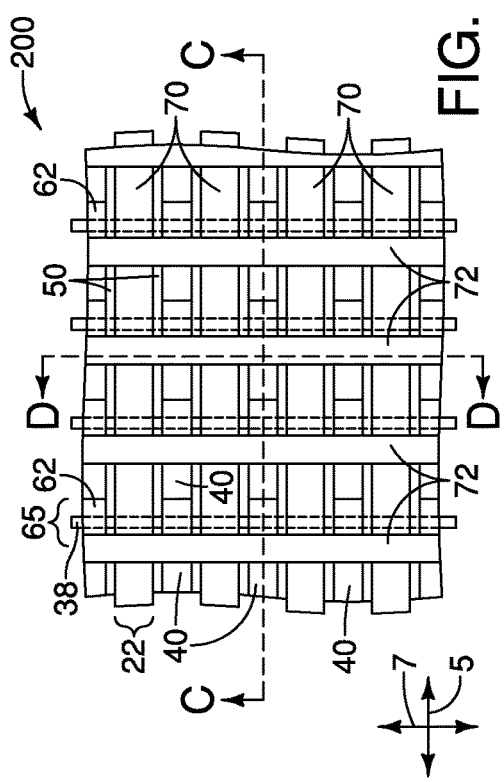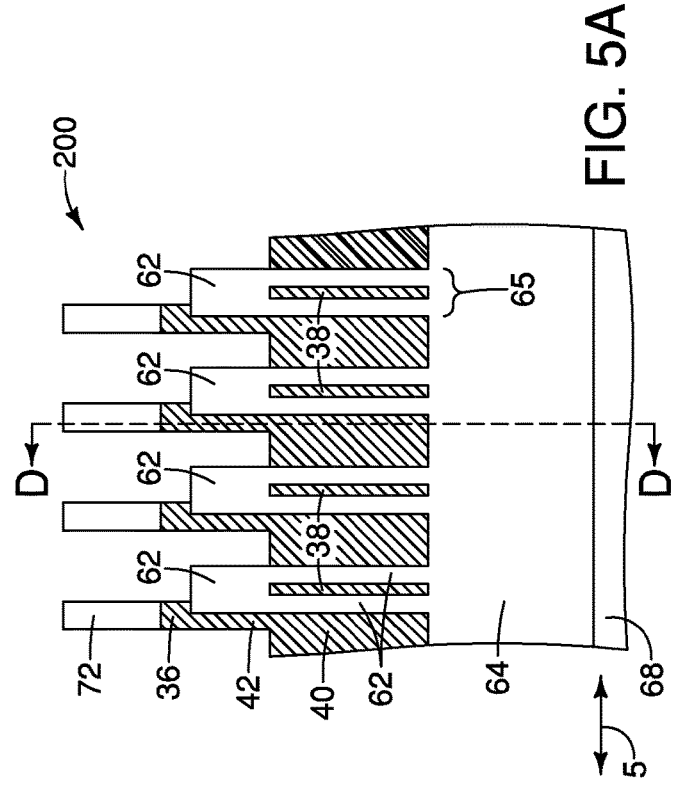

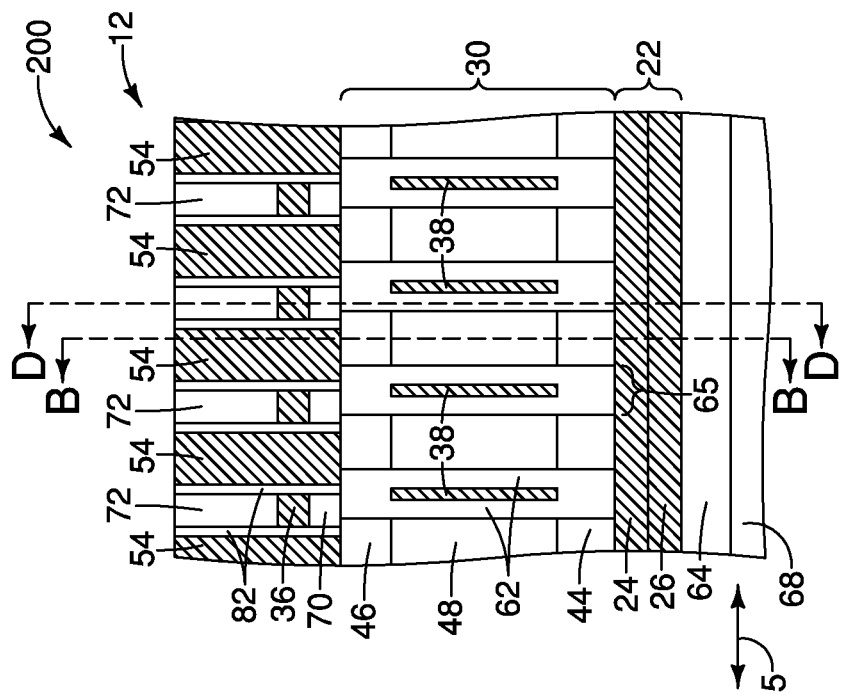
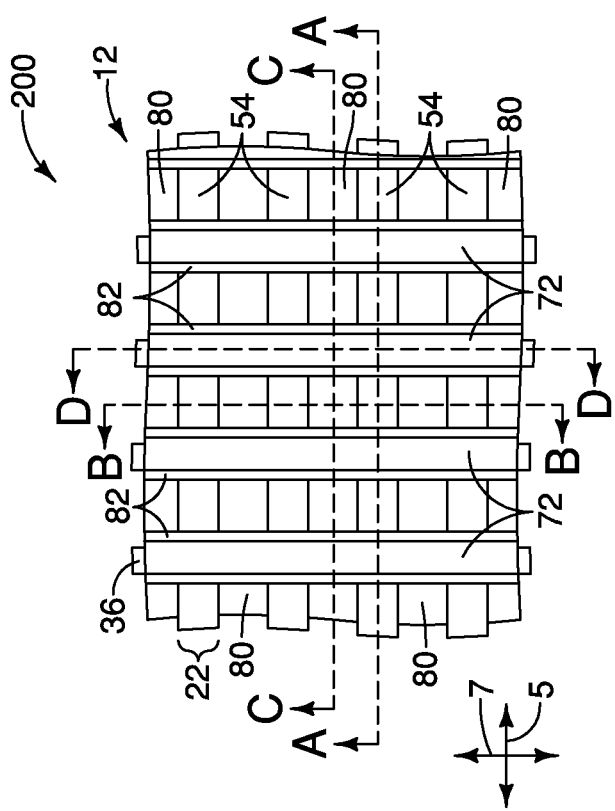

ASSEMBLIES WHICH INCLUDE WORDLINES OVER GATE ELECTRODES

TECHNICAL FIELD

Assemblies which include wordlines over gate electrodes.

BACKGROUND

Integrated memory may utilize access transistors having vertical pillar-type active regions. In some applications, bitlines may extend beneath the active regions and wordlines may extend along the active regions. The wordlines may comprise segments serving as gate electrodes, with such segments being spaced from the active regions by gate dielectric. A problem with such architectures is that it is difficult to scale the architectures into higher densities of integration. Specifically, the spacing between neighboring active regions becomes narrower as the architectures are downscaled. Accordingly, the wordlines formed between the neighboring active regions become narrower, which increases wordline resistance. Also, tighter packing of the wordlines and access transistors may increase disturbance between neighboring access transistors.

Shield lines may be introduced in an attempt to reduce disturbance between neighboring access transistors. However, the shield lines may consume valuable real estate between adjacent access transistors and thereby further reduce space available for the wordlines, resulting in even narrower wordlines with even higher resistance.

It would be desirable to develop new architectures for integrated memory which alleviate or prevent the above-described problems.

BRIEF DESCRIPTION OF THE DRAWINGS

FIGS. 3-6 are top views of an integrated assembly at process stages of an example method for fabricating an example integrated memory architecture. The views of FIGS. 4-6 are inverted relative to that of FIG. 3.

FIGS. 5A and 5B are diagrammatic cross-sectional side views along the lines C-C and D-D of FIG. 5, respectively. The view of FIG. 5B is along the line D-D of FIG. 5A, and the view of FIG. 5A is along the line C-C of FIG. 5B.

FIGS. 6A, 6B, 6C and 6D are diagrammatic cross-sectional side views along the lines A-A, B-B, C-C and D-D of FIG. 6, respectively. The view of FIG. 6A is along the lines A-A of FIGS. 6B and 6D; the view of FIG. 6B is along the lines B-B of FIGS. 6A and 6C; the view of FIG. 6C is along the lines C-C of FIGS. 6B and 6D; and the view of FIG. 6D is along the lines D-D of FIGS. 6A and 6C.

DETAILED DESCRIPTION OF THE ILLUSTRATED EMBODIMENTS

In some embodiments, integrated memory architectures include wordlines which are vertically above semiconductor pillars, and which are coupled with gate electrodes beneath the wordlines and between the semiconductor pillars. Formation of the wordlines above the semiconductor pillars eliminates restrictions on wordline widths as compared to conventional architectures having the wordlines between the semiconductor pillars, and may thereby enable the wordlines to be formed to thicker widths even as integrated circuit density is increased. Accordingly, the wordlines utilized in the integrated memory architectures described may have lower resistance as compared to wordlines utilized in conventional integrated memory architectures. In some embodiments, shield lines may be introduced to reduce disturbance between neighboring access transistors in tightly-packed integrated circuit architectures. Example embodiments are described below with reference to FIGS. 1-7.

Figure 1:
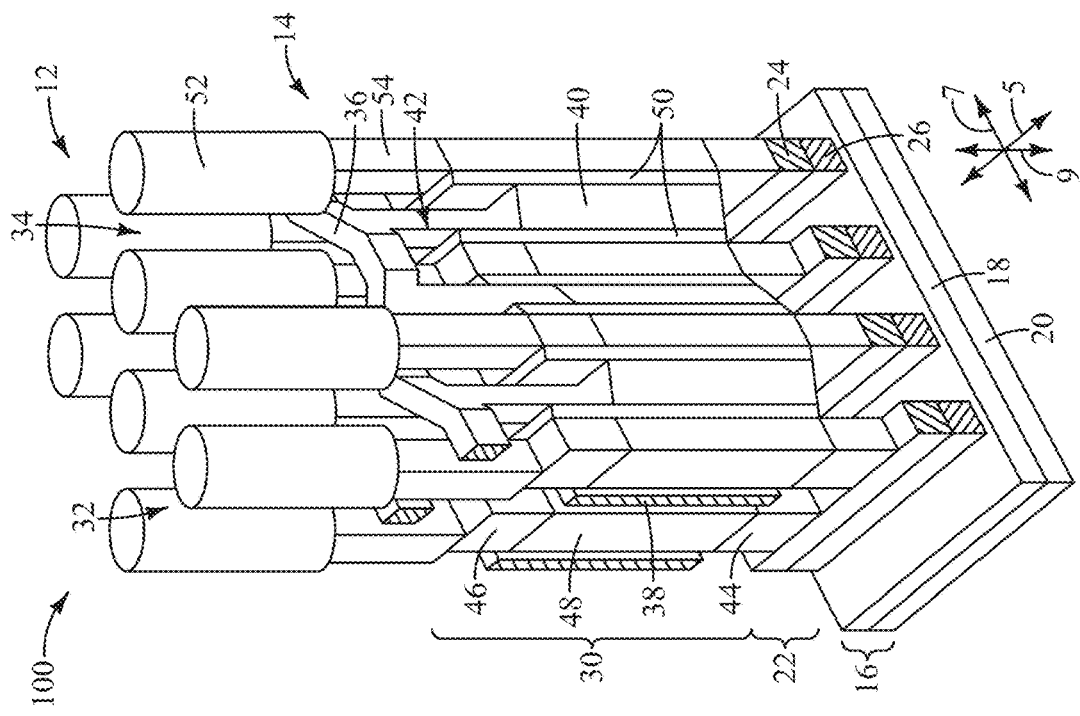
FIG. 1 is a three-dimensional view of an example integrated memory architecture.

Referring to FIG. 1, such shows an assembly 10 comprising an example integrated memory architecture 12. Such architecture includes a memory array 14 supported by a base 16. The base 16 may include insulative material 18 (for instance, silicon dioxide) over a semiconductor substrate 20. The semiconductor substrate 20 may comprise semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Bitlines 22 are over the base 16, and extend along an axis 5 corresponding to a first direction (which may be referred to as a first lateral direction). The bitlines 22 may comprise any suitable electrically conductive composition or combination of compositions. In the illustrated embodiment, each of the bitlines comprises a first conductive layer 24 over a second conductive layer 26. In some embodiments, the first conductive layer 24 may comprise, consist essentially of, or consist of conductively-doped semiconductor material (such as, for example, conductively-doped polycrystalline silicon); and the second conductive layer 26 may comprise, consist essentially of, or consist of metal and/or metal-containing material (for instance, titanium nitride over tungsten).

Semiconductor pillars 30 are vertically displaced relative to the bitlines (specifically, are over the bitlines), and are arranged in the array 14. The array 14 comprises columns extending along the first direction of axis 5, and comprises rows extending along a second direction represented by an axis 7 (in some embodiments, the second direction along the axis 7 may be referred to as a second lateral direction). The second direction of axis 7 crosses the first direction of axis 5. In the illustrated embodiment, the second direction of axis 7 is substantially orthogonal to the first direction of axis 5 (with the term "substantially orthogonal" meaning orthogonal to within reasonable tolerances of fabrication and measurement). In other embodiments, the axis 7 may cross the axis 5 without being substantially orthogonal to the axis 5.

Each of the semiconductor pillars 30 extends vertically (i.e., extends along a vertical direction, or third direction, of an axis 9). In the illustrated embodiment, the third direction of axis 9 is substantially orthogonal to the second direction of axis 7 and the first direction of axis 5. In other embodiments, the vertical direction of axis 9 may not be substantially orthogonal to one or both of the lateral directions of axis 5 and axis 7.

Each of the pillars 30 is on an associated one of the bitlines 22. For instance, one of the pillars is labeled as pillar 30*a*, and one of the bitlines is labeled as bitline 22*a*. The pillar 30*a* is associated with the bitline 22*a* and is directly on such bitline.

Each of the pillars 30 within the array 14 may be considered to have neighbors along the column direction of axis 5 and along the row direction of axis 7. First gaps 32 are between the semiconductor pillars 30 which are neighboring along the column direction of axis 5 (i.e., which are neighboring along the first direction), and second gaps 34 are between the semiconductor pillars 30 which are neighboring along the row direction of axis 7 (i.e., which are neighboring along the second direction).

Wordlines 36 extend along the second direction of axis 7, and extend along rows of the array 14. The wordlines 36 are vertically offset from the semiconductor pillars 30; and specifically are above the semiconductor pillars 30. The wordlines 36 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the wordlines may comprise tungsten and titanium nitride.

Each of the wordlines 36 may be considered to be disposed over, and electrically isolated from, an associated row of the semiconductor pillars 30. For instance, one of the wordlines is labeled as 36*a*, and such wordline is associated with a row of pillars 30 which includes the pillar 30*a*. The wordlines 36 may be isolated from the associated rows of pillars 30 utilizing one or more insulative materials (not shown in order to simplify the drawing), such as, for example, one or more of silicon dioxide, silicon nitride, etc. In the shown embodiment, the wordlines are directly over the first gaps 32 between the semiconductor pillars 30, and are not directly over the semiconductor pillars 30.

In the illustrated embodiment, shield lines 38 are provided within the first gaps 32 between neighboring pillars 30, with the shield lines 38 extending along the second direction of axis 7. The shield lines 38 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). For instance, the shield lines 38 may comprise, consist essentially of, or consist of titanium nitride. The shield lines 38 may alleviate or prevent crosstalk between neighboring pillars associated with a common bitline. The shield lines 38 are optional, and may be omitted if crosstalk between neighboring pillars is not problematic. In some embodiments, the shield lines 38 may be electrically floating, and in other embodiments one or more of the shield lines 38 may be tied to a suitable reference voltage.

Gate electrodes 40 are provided between neighboring pillars within the second gaps 34. Each of the gate electrodes 40 is downwardly elongated from an associated one of the wordlines 36. For instance, one of the gate electrodes is labeled as 40*a*, and such extends downwardly from the wordline 36*a*; with the gate electrode 40*a* being electrically coupled to the wordline 36*a* through a conductive interconnect (i.e., interconnecting region) 42.

The gate electrodes 40 and interconnecting regions 42 are shown comprising a common material as wordlines 36. In other embodiments, the gate electrodes 40 and interconnecting regions 42 may comprise different material relative to the wordlines 36; and in some embodiments the gate electrodes 40 may comprise different material relative to the interconnecting regions 42. The gate electrodes 40 and interconnecting regions 42 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the gate electrodes 40 and interconnecting regions 42 may comprise, consist essentially of, or consist of conductively-doped polycrystalline silicon.

Figure 6B:
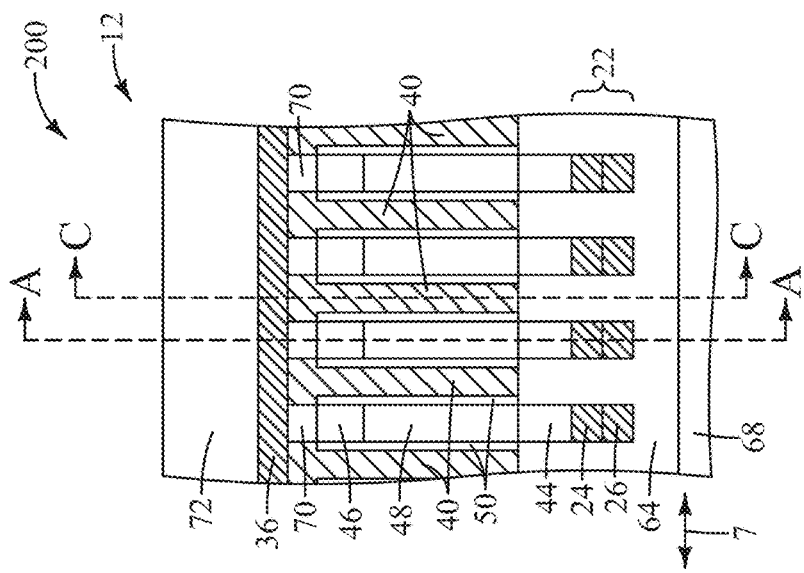

In some embodiments, each of the gate electrodes 40 may be considered to be arranged between an associated two of the semiconductor pillars 30 which are neighboring to one another along the second direction of axis 7. Such may be difficult to visualize in the three-dimensional view of FIG. 1, but may be observed relative to the cross-sectional view of FIG. 6B. In the view of FIG. 6B, a pair of neighboring semiconductor pillars are labeled as 30*a* and 30*b*, and a gate electrode associated with both of the semiconductor pillars 30*a* and 30*b* is labeled as a gate electrode 40*a*. FIG. 6B also shows that the gate electrodes 40 may be considered to have two opposing lateral sides spaced from one another along the second direction of axis 7. For instance, the gate electrode 40*a* is shown to have opposing lateral sides 41 and 43. The lateral side 41 may be considered to be spaced from the first semiconductor pillar 30*a* by a first region 45 of a gate dielectric material 50, and the lateral side 43 may be considered to be spaced from the second semiconductor pillar 30*b* by a second region 47 of the gate dielectric 50.

Referring again to FIG. 1, none of the gate electrodes 40 are within the first gaps 32 between pillars 30 along the direction of axis 5 in the illustrated embodiment.

Each of the pillars 30 comprises a pair of source/drain regions 44 and 46, with the source/drain region 44 being at the bottom of the pillar and electrically coupled with a bitline 22, and with the source/drain region 46 being at the top of the pillar. In some embodiments, the pillars 30 may comprise monocrystalline silicon, and the source/drain regions 44 and 46 may be conductively-doped regions within the monocrystalline silicon pillars. The source/drain regions 44 and 46 may be n-type doped in some embodiments, and may be p-type doped in other embodiments.

The source/drain regions 44 and 46 are spaced from one another by an intervening region 48. The intervening region 48 may be doped with a threshold voltage implant, and may comprise a channel region between the source/drain regions 44 and 46. The regions 44, 46 and 48 may be considered together as an active region of an access transistor, with such transistor being gated by one of the gate electrodes 40.

The gate dielectric material 50 is provided between the gate electrodes 40 and the associated active regions within the semiconductor pillars 30. The gate dielectric material 50 may comprise any suitable composition or combination of compositions; and in some embodiments may comprise, consist essentially of, or consist of silicon dioxide.

Programmable devices 52 are provided over the pillars 30, and are electrically coupled to the upper source/drain regions 46 through conductive contacts 54.

The programmable devices may comprise charge-storage devices (e.g., capacitors), or memory elements (e.g., memory cells comprising phase change material, resistive material, conductive bridging material, etc.).

The conductive contacts 54 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive contacts may comprise, consist essentially of, or consist of conductively doped polycrystalline silicon and/or titanium nitride. Each of the conductive contacts may be considered to be disposed over an associated one of the semiconductor pillars. For instance, one of the conductive contacts is labeled as 54a, and is disposed over an associated pillar corresponding to the pillar 30a. The conductive contacts 54 extend in the third direction of axis 9, and extend through spaces between the wordlines 36. In some embodiments, a conductive contact 54 may be considered to extend through a space between associated two of the wordlines. For instance, the conductive contact 54a may be considered to be within a space between two wordlines 36a and 36b which are associated with such conductive contact. In some embodiments, the wordlines 36a and 36b may be considered to be immediately neighboring the conductive contact 54a along the direction of the axis 5.

Each of the programmable devices 52 may be considered to be disposed over, and electrically coupled with, an associated one of the conductive contacts 54. For instance, one of the programmable devices is labeled 52a, and such is disposed over, and electrically coupled with, an associated contact corresponding to the contact 54a.

Figure 2:
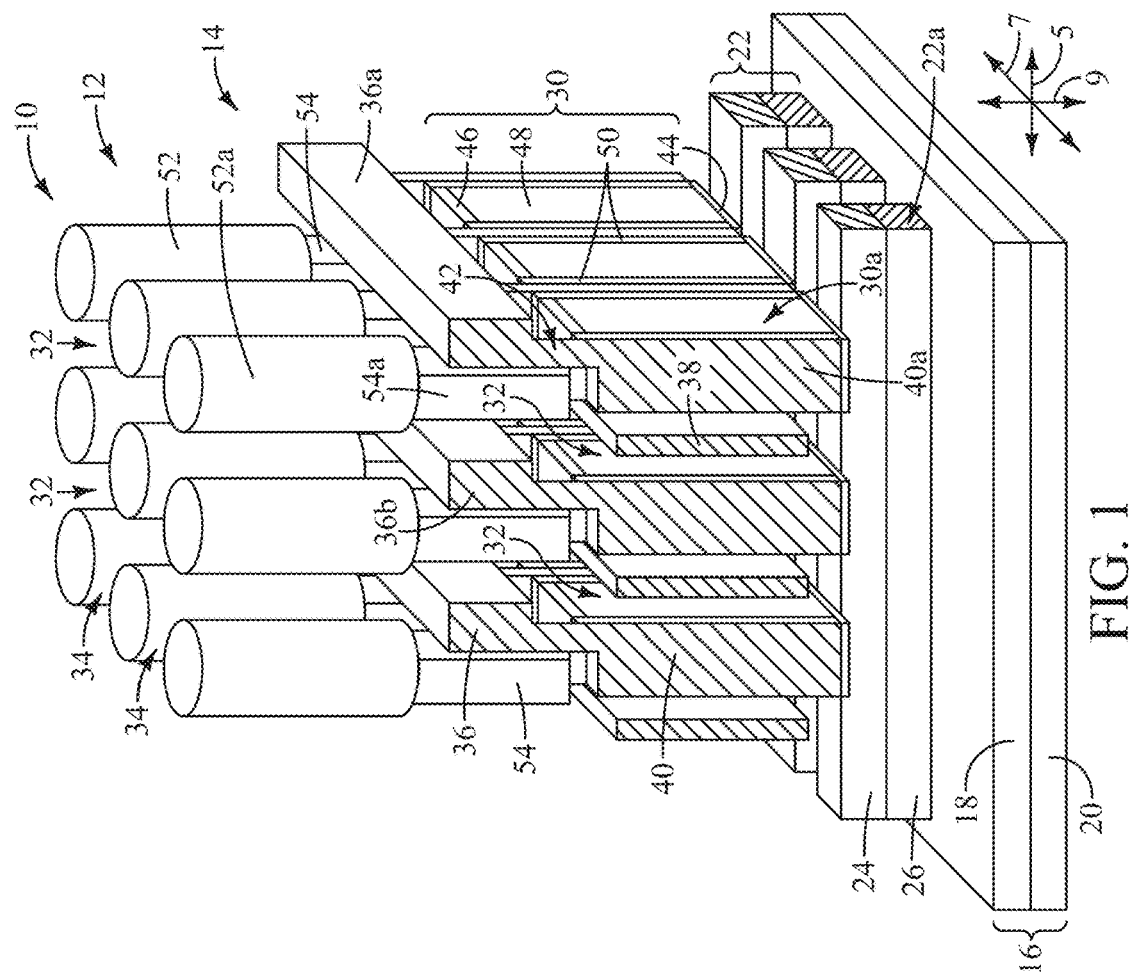
FIG. 2 is a three-dimensional view of another example integrated memory architecture.

The contacts 54 and programmable devices 52 are arranged in a square pattern in the embodiment of FIG. 1 (i.e., are arranged squarely relative to a top view of the embodiment of FIG. 1). FIG. 2 shows an assembly 100 comprising an embodiment analogous to that of FIG. 1, but in which the various structures and components are arranged to enable hexagonal packing of the pillars 30, contacts 54 and programmable devices 52. Specifically, the semiconductor pillars 30 are arranged in zigzags along the second direction of axis 7. The contacts 54 and programmable devices 52 are arranged hexagonally (i.e., are hexagonally packed). The wordlines 36 extend in a corrugated shape along the second direction of axis 7.

The assemblies of FIGS. 1 and 2 may be formed with any suitable processing. Example processing which may be utilized to form the assembly of FIG. 1 is described with reference to FIGS. 3-6. It is to be understood that similar processing may be utilized to form the assembly of FIG. 2.

Figure 3B:
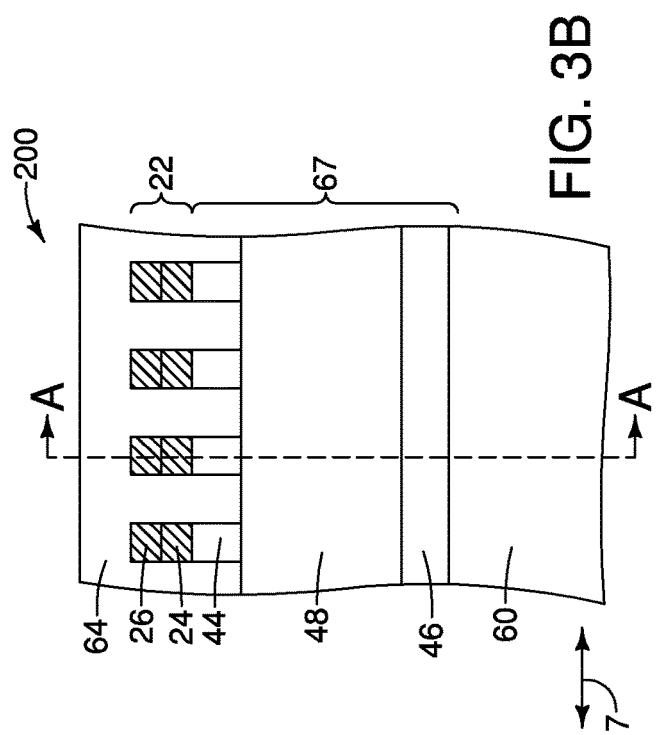
FIGS. 3A and 3B are diagrammatic cross-sectional side views along the lines A-A and B-B of FIG. 3, respectively. The view of FIG. 3B is along the line B-B of FIG. 3A, and the view of FIG. 3A is along the line A-A of FIG. 3B.
Figure 3:
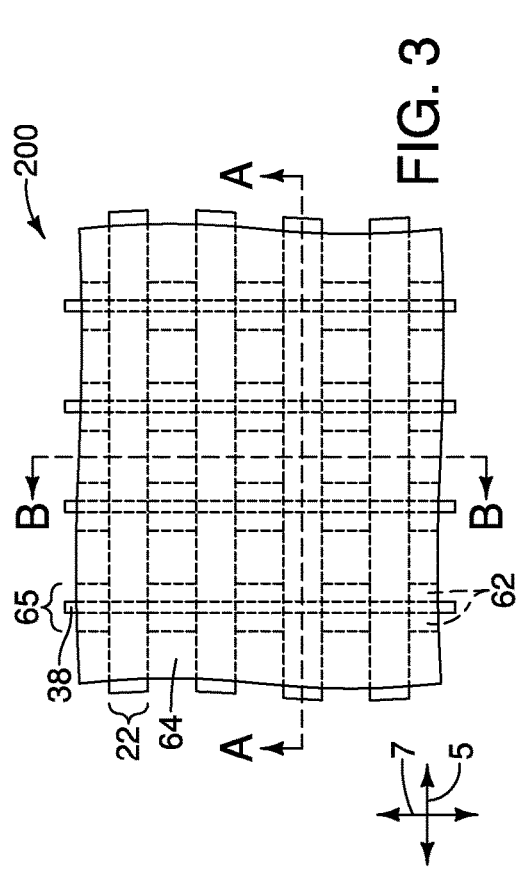
Figure 3A:
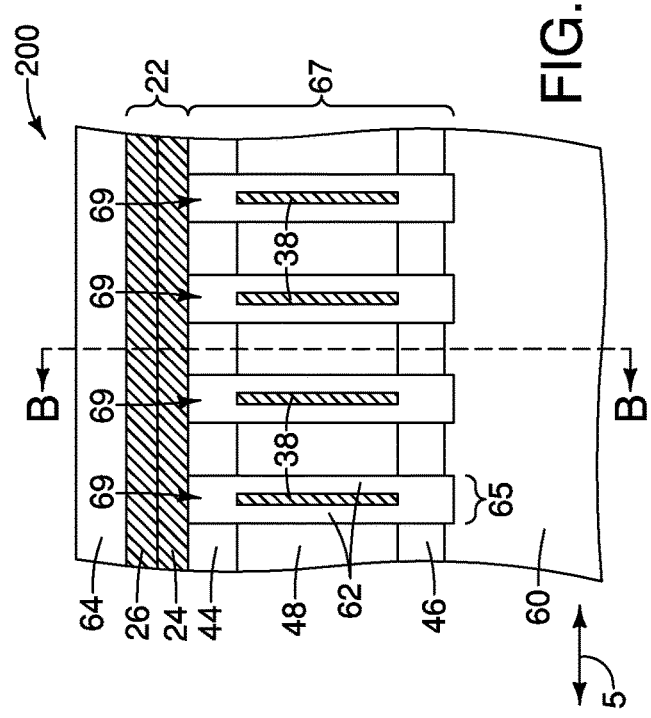

Referring to FIGS. 3-3B, an assembly 200 includes a semiconductor substrate 60. The semiconductor substrate 60 may comprise, for example, monocrystalline silicon. Active material 67 is formed along an upper region of the semiconductor substrate 60, and such active material includes conductively-doped regions 44 and 46.

The active material 67 is patterned to have trenches 69 extending therein. Isolation regions 65 are provided within the trenches 69. The isolation regions 65 include dielectric material 62 and shield lines 38. The dielectric material 62 may comprise, for example, one or both of silicon nitride and silicon dioxide.

The bitlines 22 are formed over the patterned active material 67 and isolation regions 65; and insulating material 64 is formed over and between the bitlines 22. The insulating material 64 may comprise any suitable composition or combination of compositions; and in some embodiments may comprise, consist essentially of, or consist of silicon dioxide. In some embodiments, the insulating materials 64 and 62 may comprise a same composition as one another. In other embodiments, the insulating materials 64 and 62 may comprise different compositions relative to one another.

Figure 4B:
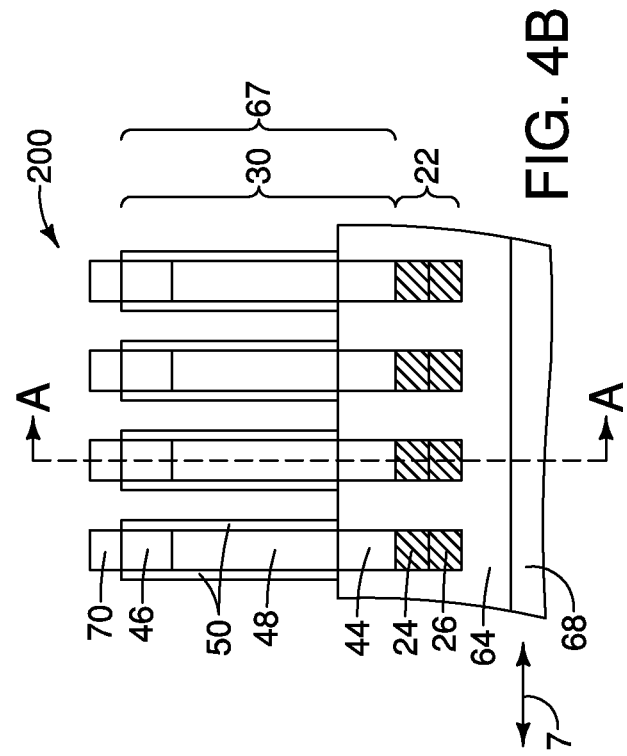
FIGS. 4A and 4B are diagrammatic cross-sectional side views along the lines A-A and B-B of FIG. 4, respectively. The view of FIG. 4B is along the line B-B of FIG. 4A, and the view of FIG. 4A is along the line A-A of FIG. 4B.
Figure 4:
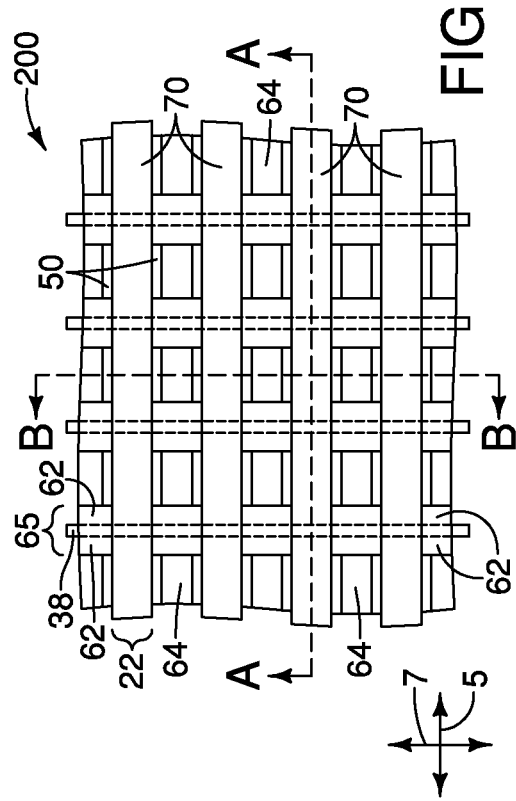
Figure 4A:
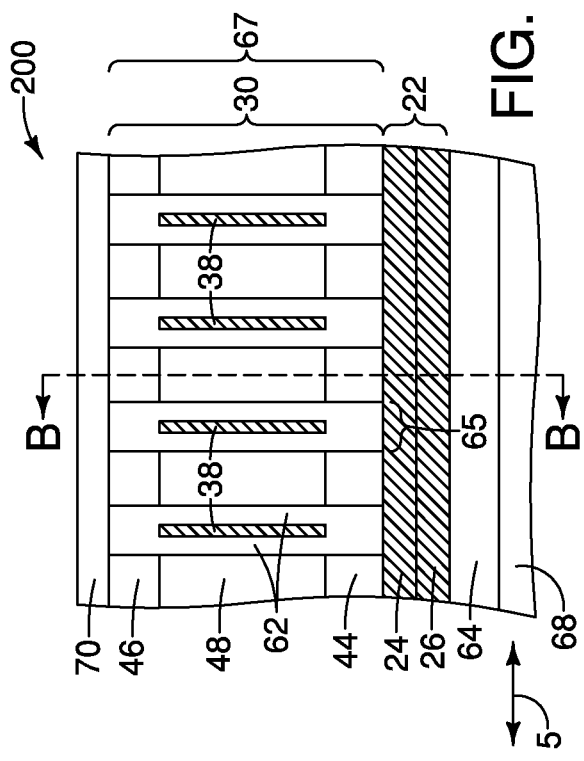

Referring to FIGS. 4-4B, the assembly 200 is inverted and the insulating material 64 is bonded to a base 68. In some embodiments, materials 64 and 68 may correspond to the materials 18 and 20 described above with reference to FIG. 1, and accordingly the materials 64 and 68 may together form a base structure 16 of the type described above with reference to FIG. 1.

Masking material 70 is formed over the active material 67, and is utilized to pattern the active material 67 into the pillars 30. The masking material 70 may comprise any suitable composition or combination of compositions; and in some embodiments may comprise silicon nitride. The gate dielectric material 50 is formed along sides of the pillars 30. The gate dielectric material 50 may be formed through deposition and or through oxidation of exposed surfaces of the semiconductor pillars 30.

Referring to FIGS. 5-5B, gate electrodes 40 and interconnects 42 are formed and patterned between the pillars 30; and the wordlines 36 are formed and patterned to be over and electrically connected with the interconnects 42. Dielectric material 72 is formed over the wordlines 36, and is patterned with the wordlines 36. The dielectric material 72 may comprise any suitable composition or combination of compositions; such as, for example, one or both of silicon dioxide and silicon nitride. In the shown embodiment, the wordlines 36, interconnects 42 and gate electrodes 40 comprise a common composition as one another. In other embodiments, one or more of the wordlines 36, interconnects 42 and gate electrodes 40 may comprise a different composition relative to one or more of the others of the wordlines 36, interconnects 42 and gate electrodes 40. Also, in the shown embodiment of FIGS. 5-5B the insulative materials 62 and 64 comprise a common composition as one another. In other embodiments, the insulative materials 62 and 64 may comprise different compositions relative to one another.

Figure 6C:
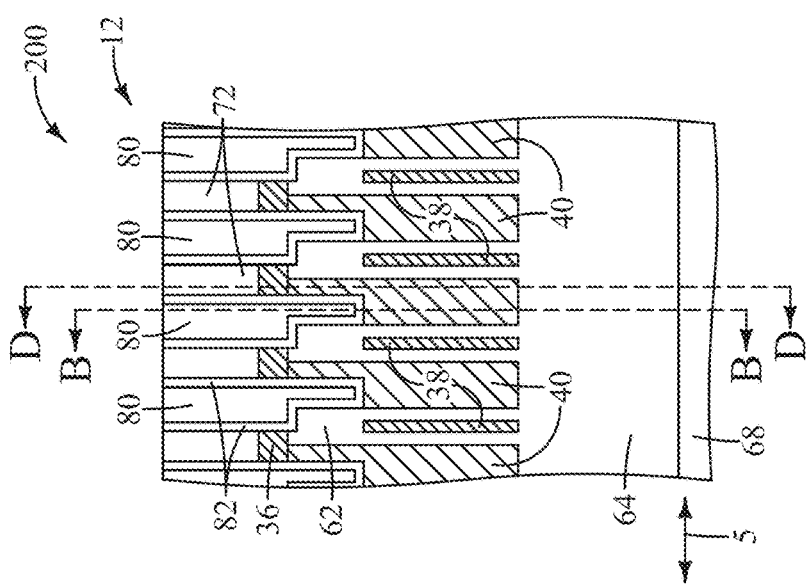
Figure 6D:
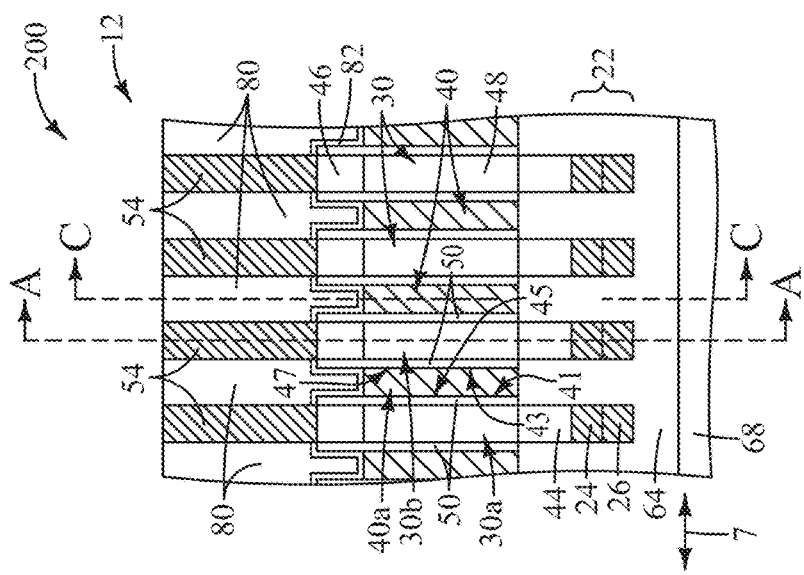

Referring to FIGS. 6-6D, insulative material 82 is formed along the sides of the wordlines 36 and the dielectric material 72 to form insulative liners. The insulative material 82 may comprise any suitable composition or combination of compositions; and in some embodiments may comprise silicon nitride. Insulative material 80 fills gaps between the insulative liners of material 82. The insulative material 80 may comprise any suitable composition or combination of compositions; and in some embodiments may comprise, consist essentially of, or consist of silicon dioxide. Also, insulative material 70 is removed from over the tops of pillars 70 and conductive contacts 54 are formed between the wordlines and in electrical contact with the tops of pillars 70 (i.e., in contact with the upper source/drain regions 46) after removal of material 70 and formation of the insulative liners of material 82. Subsequently, programmable devices may be formed over and in electrical connection with the contacts 54 (the programmable devices are not shown in FIGS. 6-6D, but such may be identical to the programmable devices 52 of FIG. 1).

The assembly 200 of FIGS. 6-6D comprises a memory array 12 analogous to that described above with reference to FIG. 1.

Figure 7A:
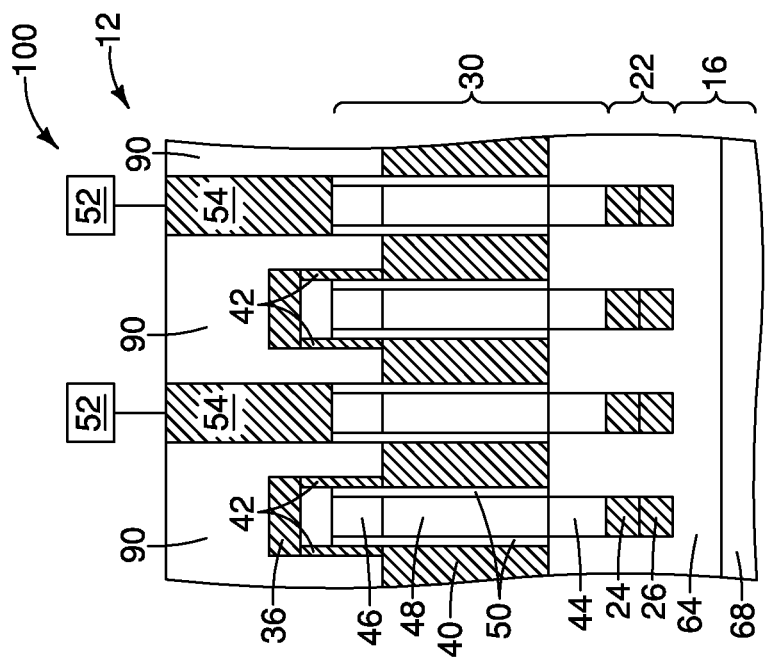
FIGS. 7A, 7B and 7C are diagrammatic cross-sectional side views along the lines A-A, B-B and C-C of FIG. 7, respectively. The view of FIG. 7A is along the lines A-A of FIGS. 7B and 7C; the view of FIG. 7B is along the line B-B of FIG. 7A; and the view of FIG. 7C is along the line C-C of FIG. 7A.
Figure 7:
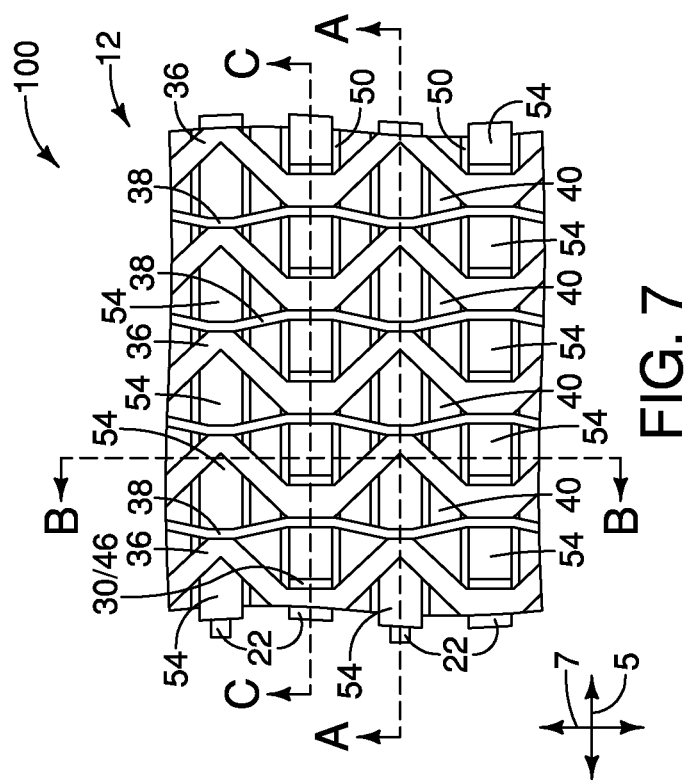
FIG. 7 is a top-down view of various structures of an integrated assembly analogous to that of FIG. 2; lateral relationships of the structures are diagrammed and vertical relationships are ignored.
Figure 7C:
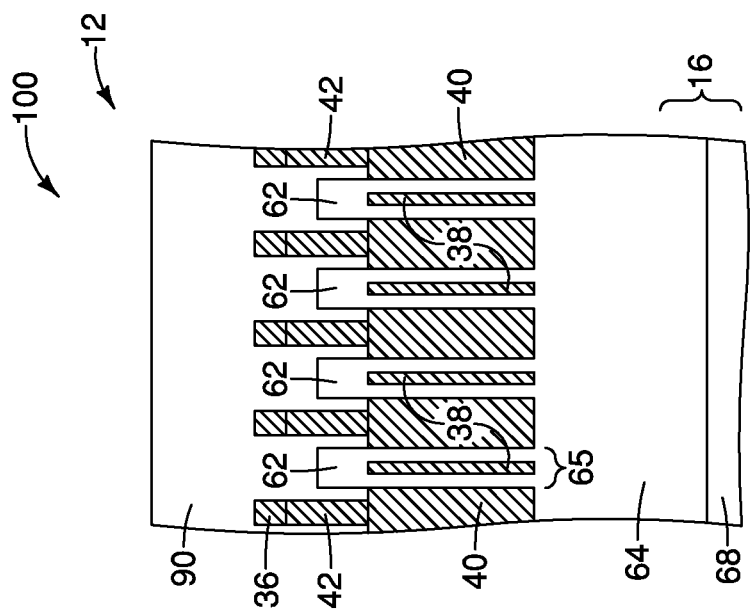
Figure 7B:
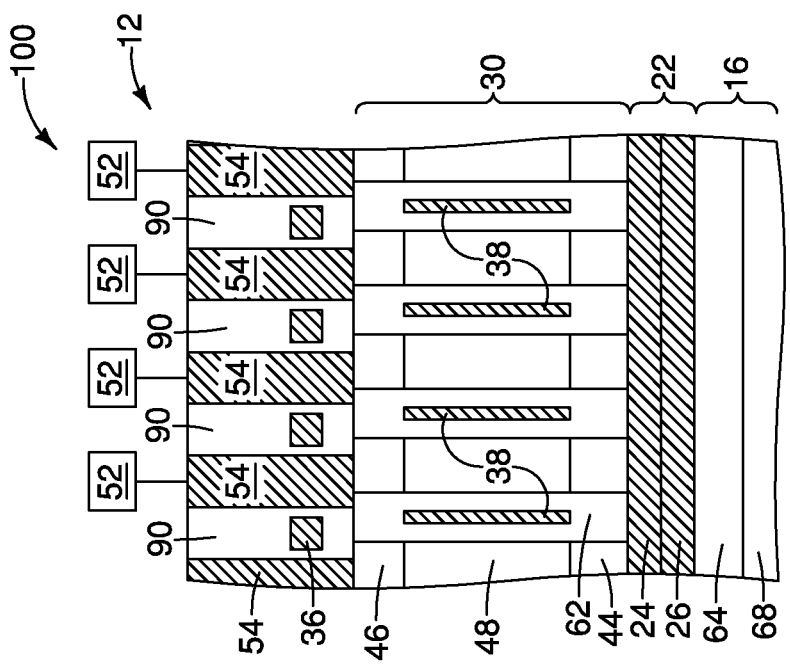

FIGS. 7-7C show the assembly 100 of FIG. 2 from a top-down view (FIG. 7), and along several cross-sectional side views (FIGS. 7A-C). Such views may assist the reader in understanding the relationships of the various structural components of assembly 100. The top-down view of FIG. 7 shows lateral relationships of various structures, and ignores vertical relationships so that features which would be hidden in a traditional top-down view may be better illustrated. Insulative material 90 is shown in FIGS. 7A-7C, and not shown in FIGS. 2 and 7. Such insulative material 90 may comprise any suitable composition or combination of compositions; including, for example, one or both of silicon dioxide and silicon nitride. In the shown embodiment, the wordlines 36, interconnects 42 and gate electrodes 40 comprise different compositions relative to one another. In other embodiments, the wordlines 36, interconnects 42 and gate electrodes 40 may comprise a common composition as one another.

The programmable devices 52 are diagrammatically illustrated in FIGS. 7A and 7B; but otherwise are not shown in order to simplify the drawings. The structures 64 and 68 of FIGS. 7-7C are the same as identical structures of FIGS. 4-4B, and may encompass the structures 18 and 20 described with reference to FIG. 2. Other structures described above with reference to FIGS. 3-6 are also shown in FIG. 7 (for instance, dielectric material 62) in order to indicate that the structure of FIG. 7 may be formed with processing analogous to that of FIGS. 3-6 in some embodiments.

The assemblies discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include an assembly having bitlines over a base and extending in a first direction. Semiconductor pillars are arranged in an array having columns along the first direction and having rows along a second direction which crosses the first direction. Each of the semiconductor pillars extends in a third direction perpendicular to the first and second directions and is on an associated one of the bitlines. Wordlines extend in the second direction. Each of the wordlines is disposed over, and electrically isolated from, an associated row of the semiconductor pillars. The assembly includes a plurality of gate electrodes. Each of the gate electrodes is downwardly elongated from an associated one of the wordlines and is arranged between associated two of the semiconductor pillars adjacent in the second direction to one another. None of the gate electrodes is provided between the semiconductor pillars adjacent in the first direction to one another.

Some embodiments include an assembly which includes semiconductor pillars arranged in an array. The array includes columns along a first lateral direction and rows along a second lateral direction which crosses the first lateral direction. Each of the semiconductor pillars extends vertically. First gaps are between the semiconductor pillars which are neighboring along the first lateral direction, and second gaps are between the semiconductor pillars which are neighboring along the second lateral direction. Bitlines extend along the first lateral direction and are vertically offset from the semiconductor pillars such that the bitlines are below the semiconductor pillars. Wordlines extend along the second lateral direction and are vertically offset from the semiconductor pillars such that the wordlines are above the semiconductor pillars. Gate electrodes are laterally between the semiconductor pillars and are electrically coupled with the wordlines. Each of the gate electrodes is within one of the second gaps. None of the gate electrodes is within the first gaps. Each of the gate electrodes has two opposing lateral sides spaced from one another along the second lateral direction. One of said opposing lateral sides is spaced from an associated first of the semiconductor pillars by a first region of a gate dielectric material, and the other of the opposing lateral sides is spaced from an associated second of the semiconductor pillars by a second region of the gate dielectric material.

Some embodiments include an assembly which includes bitlines supported by a base. Each of the bitlines extends along a first direction. Semiconductor pillars are over the bitlines and are arranged in an array. The array includes columns along the first direction and rows along a second direction which crosses the first direction. Each of the semiconductor pillars extends vertically and is elevationally over the bitlines. The semiconductor pillars are directly over the bitlines. The semiconductor pillars are spaced from one another along the first direction by first gaps, and are spaced from one another along the second direction by second gaps. Wordlines extend along the second direction, and are elevationally above the semiconductor pillars. The wordlines are directly over the first gaps and are not directly over the semiconductor pillars. Gate electrodes are beneath the wordlines and are electrically coupled with the wordlines. Each of the gate electrodes is within one of the second gaps. Shield lines are within the first gaps.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An assembly comprising:
bitlines over a base and extending in a first direction;
semiconductor pillars arranged in an array having columns along the first direction and having rows along a second direction which crosses the first direction, each of the semiconductor pillars extending in a third direction perpendicular to the first and second directions and being on an associated one of the bitlines;
wordlines extending in the second direction; each of the wordlines being disposed over, and electrically isolated from, an associated row of the semiconductor pillars;
a plurality of gate electrodes, each of the gate electrodes of said plurality of gate electrodes having a first width across the first direction and being entirely elevationally lower than an associated one of the wordlines, being downwardly elongated from the associated one of the wordlines, and being arranged between associated two of the semiconductor pillars adjacent in the second direction to one another, none of the gate electrodes being provided between the semiconductor pillars adjacent in the first direction to one another; first portions of the gate electrodes being laterally offset relative to the wordlines, and second portions of the gate electrodes vertically underlying the wordlines; and
a plurality of conductive interconnects, each of the conductive interconnects coupling one of the gate electrodes to one of the wordlines, the conductive interconnects having a second width along the first direction that is less than the first width and less than an overall width of each wordline along the first direction.

2. The assembly of claim 1, further comprising a plurality of shield lines, each of the shield lines of said plurality of shield lines extending along the second direction between associated two of semiconductor pillars adjacent in the first direction each other.

3. The assembly of claim 1, further comprising a plurality of contacts, each of the contacts of said plurality of contacts being disposed over an associated one of the semiconductor pillars, and extending in the third direction through a space between associated two of the wordlines to electrically connect to the associated one of the semiconductor pillars.

4. The assembly of claim 3, wherein the contacts of said plurality of contacts are squarely arranged in a top view.

5. The assembly of claim 3, wherein the semiconductor pillars are arranged in zigzags in the second direction, wherein the contacts of said plurality of contacts are hexagonally arranged in a top view, and wherein the wordlines extend in a corrugated shape in the second direction.

6. The assembly of claim 3, further comprising a plurality of capacitors, each of the capacitors of said plurality of capacitors being electrically connected to an associated one of the contacts of said plurality of contacts.

7. The assembly of claim 3, further comprising a plurality of programmable devices, each of the programmable devices of said plurality of programmable devices being electrically connected to an associated one of the contacts of said plurality of contacts.

8. An assembly comprising:
semiconductor pillars arranged in an array; the array comprising columns along a first lateral direction and rows along a second lateral direction which crosses the first lateral direction; each of the semiconductor pillars extending vertically; first gaps being between the semiconductor pillars which are neighboring along the first lateral direction, and second gaps being between the semiconductor pillars which are neighboring along the second lateral direction;
bitlines extending along the first lateral direction and being vertically offset from the semiconductor pillars such that the bitlines are below the semiconductor pillars;
wordlines extending along the second lateral direction, having a wordline width along the first direction, and being vertically offset from the semiconductor pillars such that the wordlines are above the semiconductor pillars; and
gate electrodes laterally between the semiconductor pillars and electrically coupled with the wordlines through conductive interconnects that are more narrow along the first direction than the wordline width and that extend between upper surfaces of the gate electrodes and bottom surfaces of the wordlines, each of the gate electrodes being within one of the second gaps, none of the gate electrodes being within the first gaps; each of the gate electrodes having two opposing lateral sides spaced from one another along the second lateral direction; one of said opposing lateral sides being spaced from an associated first of the semiconductor pillars by a first region of a gate dielectric material, and the other of the opposing lateral sides being spaced from an associated second of the semiconductor pillars by a second region of the gate dielectric material; first portions of the gate electrodes being disposed elevationally lower than the wordlines and being laterally offset relative to the wordlines, and second portions of the gate electrodes vertically underlying the wordlines, with an entirety of the gate electrodes being elevationally lower than the wordlines.

9. The assembly of claim 8, further comprising conductive shield lines within the first gaps.

10. The assembly of claim 9, wherein the conductive shield lines are metal-containing shield lines.

11. The assembly of claim 10, wherein the metal-containing shield lines comprise titanium nitride.

12. The assembly of claim 8, further comprising a plurality of contacts, with each of the contacts of said plurality of contacts being disposed over an associated one of the semiconductor pillars.

13. The assembly of claim 12, wherein the contacts of said plurality of contacts are squarely arranged in a top view.

14. The assembly of claim 12, wherein the semiconductor pillars are arranged in zigzags in the second direction, wherein the contacts of said plurality of contacts are hexagonally arranged in a top view, and wherein the wordlines extend in a corrugated shape in the second direction.

15. An assembly comprising:
bitlines supported by a base, each of the bitlines extending along a first direction;
semiconductor pillars over the bitlines and arranged in an array; the array comprising columns along the first direction and rows along a second direction which crosses the first direction; each of the semiconductor pillars extending vertically and being elevationally over the bitlines; the semiconductor pillars being directly over the bitlines; the semiconductor pillars being spaced from one another along the first direction by first gaps, and being spaced from one another along the second direction by second gaps;
wordlines extending along the second direction, having a wordline width along the first direction, and being elevationally above the semiconductor pillars, portions of the wordlines being directly over the first gaps and not being directly over the semiconductor pillars;
gate electrodes beneath the wordlines and electrically coupled with the wordlines; each of the gate electrodes being within one of the second gaps; first portions of the gate electrodes being disposed elevationally lower than the wordlines and being laterally offset relative to the wordlines, and second portions of the gate electrodes vertically underlying the wordlines, an entirety of the gate electrodes being elevationally lower than the wordlines, the gate electrodes being vertically spaced from the wordlines and being electrically coupled to the wordlines through intervening conductive interconnects that are more narrow along the first direction than the wordline width; and
shield lines within the first gaps.

16. The assembly of claim 15, wherein the shield lines comprise metal.

17. The assembly of claim 15, wherein the shield lines are electrically floating.

18. The assembly of claim 15, further comprising a plurality of programmable devices, each of the programmable devices of said plurality of programmable devices being electrically coupled with an associated one of the semiconductor pillars.

19. The assembly of claim 15, further comprising a plurality of charge-storage devices, each of the charge-storage devices of said plurality of charge-storage devices being electrically coupled with an associated one of the semiconductor pillars.

20. The assembly of claim 19, wherein the charge-storage devices of said plurality of charge-storage devices are capacitors.

21. The assembly of claim 19, wherein the charge-storage devices of said plurality of charge-storage devices are squarely arranged in a top view.

22. The assembly of claim 19, wherein the semiconductor pillars are arranged in zigzags in the second direction, wherein said plurality of charge-storage devices are hexagonally arranged in a top view, and wherein the wordlines extend in a corrugated shape in the second direction.

* * * * *

UNITED STATES PATENT AND TRADEMARK OFFICE
CERTIFICATE OF CORRECTION

PATENT NO. : 10,546,811 B2
APPLICATION NO. : 15/592027
DATED : January 28, 2020
INVENTOR(S) : Mitsunari Sukekawa Page 1 of 1

It is certified that error appears in the above-identified patent and that said Letters Patent is hereby corrected as shown below:

In the Claims

Column 9, Line 56 - Replace "direction each" with --direction relative to each--

Signed and Sealed this
Fourth Day of August, 2020

Andrei Iancu
*Director of the United States Patent and Trademark Office*